(12) United States Patent
Khan et al.

(10) Patent No.: US 8,726,205 B1
(45) Date of Patent: May 13, 2014

(54) OPTIMIZED SIMULATION TECHNIQUE FOR DESIGN VERIFICATION OF AN ELECTRONIC CIRCUIT

(71) Applicants: Amanulla Khan, Karnataka (IN); Punit Kishore, Karnataka (IN)

(72) Inventors: Amanulla Khan, Karnataka (IN); Punit Kishore, Karnataka (IN)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/862,492

(22) Filed: Apr. 15, 2013

(51) Int. Cl.
*G06F 17/50* (2006.01)

(52) U.S. Cl.
USPC .......................................................... 716/104

(58) Field of Classification Search
USPC .......................................................... 716/104
See application file for complete search history.

(56) References Cited

U.S. PATENT DOCUMENTS

| | | | |
|---|---|---|---|
| 5,251,159 A | 10/1993 | Rowson | |
| 6,058,492 A | 5/2000 | Sample et al. | |
| 6,336,087 B2 | 1/2002 | Burgun et al. | |
| 6,530,072 B1 * | 3/2003 | Hagerman et al. | 716/103 |
| 7,269,809 B2 | 9/2007 | Shastri et al. | |
| 2003/0025490 A1 | 2/2003 | Chen | |
| 2005/0010882 A1 * | 1/2005 | Winkelmann et al. | 716/5 |

FOREIGN PATENT DOCUMENTS

EP 1221663 B1 7/2002

* cited by examiner

*Primary Examiner* — Suresh Memula
(74) *Attorney, Agent, or Firm* — Raj Abhyanker, P.C.

(57) ABSTRACT

A method includes reading, through a processor of a computing device communicatively coupled to a memory, a design of an electronic circuit at a first level higher than a second level at which design verification and/or design simulation of the electronic circuit is to be conducted, and representing instances of elements of the electronic circuit in a data structure. The method also includes parsing, at the first level, the design to automatically generate a list of regular expressions related to text-matching strings with the elements of the electronic circuit based on removing undesired instances related to the elements from the data structure, and pruning, at the second level, connectivity descriptors of the electronic circuit based on the automatically generated list of regular expressions. Further, the method includes optimizing the design verification and/or the design simulation at the second level based on the pruned connectivity descriptors thereof.

20 Claims, 5 Drawing Sheets

OPTIMIZED SIMULATION TECHNIQUE FOR DESIGN VERIFICATION OF AN ELECTRONIC CIRCUIT

FIELD OF TECHNOLOGY

This disclosure relates generally to electronic circuit simulation and verification and, more particularly, to a method, a device and/or a system of an optimized simulation technique for design verification of an electronic circuit.

BACKGROUND

A complex electronic circuit (e.g., a Very-Large-Scale-Integration (VLSI) circuit) may include several elements and interconnectors thereof. During gate-level simulation/verification of the electronic circuit, connectivity descriptors (e.g., netlists) of the electronic circuit may be pruned based on a list of regular expressions related to text-matching strings with elements of the electronic circuit. The aforementioned list may be manually provided by a user (e.g., a verification engineer) of a computing device executing the simulation/verification. Due to the manual nature of the aforementioned list-provision process, it may be impossible to scan the complete design of the electronic circuit. Further, the failures of the simulation/verification process may be followed by several iterations for successful completion thereof.

The complexity of the electronic circuit, the impossibility of preconditioning and/or the manual nature of the list-provision process may also combine to leave a large memory footprint during the design simulation/verification. This, combined with the long simulation/verification time, may lead to frustration on part of the verification engineer.

SUMMARY

Disclosed are a method, a device and/or a system of an optimized simulation technique for design verification of an electronic circuit.

In one aspect, a method includes reading, through a processor of a computing device communicatively coupled to a memory, a design of an electronic circuit at a first level higher than a second level at which design verification and/or design simulation of the electronic circuit is to be conducted, and representing instances of elements of the electronic circuit in a data structure. The method also includes parsing, through the processor at the first level, the design of the electronic circuit to automatically generate a list of regular expressions related to text-matching strings with the elements of the electronic circuit based on removing undesired instances related to the elements of the electronic circuit from the data structure, and pruning, through the processor at the second level, connectivity descriptors of the electronic circuit based on the automatically generated list of regular expressions at the first level.

Further, the method includes optimizing the design verification and/or the design simulation of the electronic circuit at the second level based on the pruned connectivity descriptors thereof.

In another aspect, a computing device includes a memory, and a processor communicatively coupled to a memory. The processor is configured to execute instructions to read a design of an electronic circuit at a first level higher than a second level at which design verification and/or design simulation of the electronic circuit is to be conducted, and to represent instances of elements of the electronic circuit in a data structure. The processor is also configured to parse, at the first level, the design of the electronic circuit to automatically generate a list of regular expressions related to text-matching strings with the elements of the electronic circuit based on removing undesired instances related to the elements of the electronic circuit from the data structure, and to prune, at the second level, connectivity descriptors of the electronic circuit based on the automatically generated list of regular expressions at the first level.

Further, the processor is configured to execute instructions to optimize the design verification and/or the design simulation of the electronic circuit at the second level based on the pruned connectivity descriptors thereof.

In yet another aspect, a non-transitory medium, readable through a computing device and including instructions embodied therein that are executable through the computing device, is disclosed. The non-transitory medium includes instructions to read, through a processor of the computing device communicatively coupled to a memory, a design of an electronic circuit at a first level higher than a second level at which design verification and/or design simulation of the electronic circuit is to be conducted, and to represent instances of elements of the electronic circuit in a data structure.

The non-transitory medium also includes instructions to parse, through the processor at the first level, the design of the electronic circuit to automatically generate a list of regular expressions related to text-matching strings with the elements of the electronic circuit based on removing undesired instances related to the elements of the electronic circuit from the data structure, and to prune, through the processor at the second level, connectivity descriptors of the electronic circuit based on the automatically generated list of regular expressions at the first level. Further, the non-transitory medium includes instructions to optimize the design verification and/or the design simulation of the electronic circuit at the second level based on the pruned connectivity descriptors thereof.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to provide a method, a system and/or a device of an optimized simulation technique for design verification of an electronic circuit. Although the present embodiments have been described with reference to specific example embodiments, it will be evident that various modifications and changes may be made to these embodiments without departing from the broader spirit and scope of the various embodiments.

Figure 1:
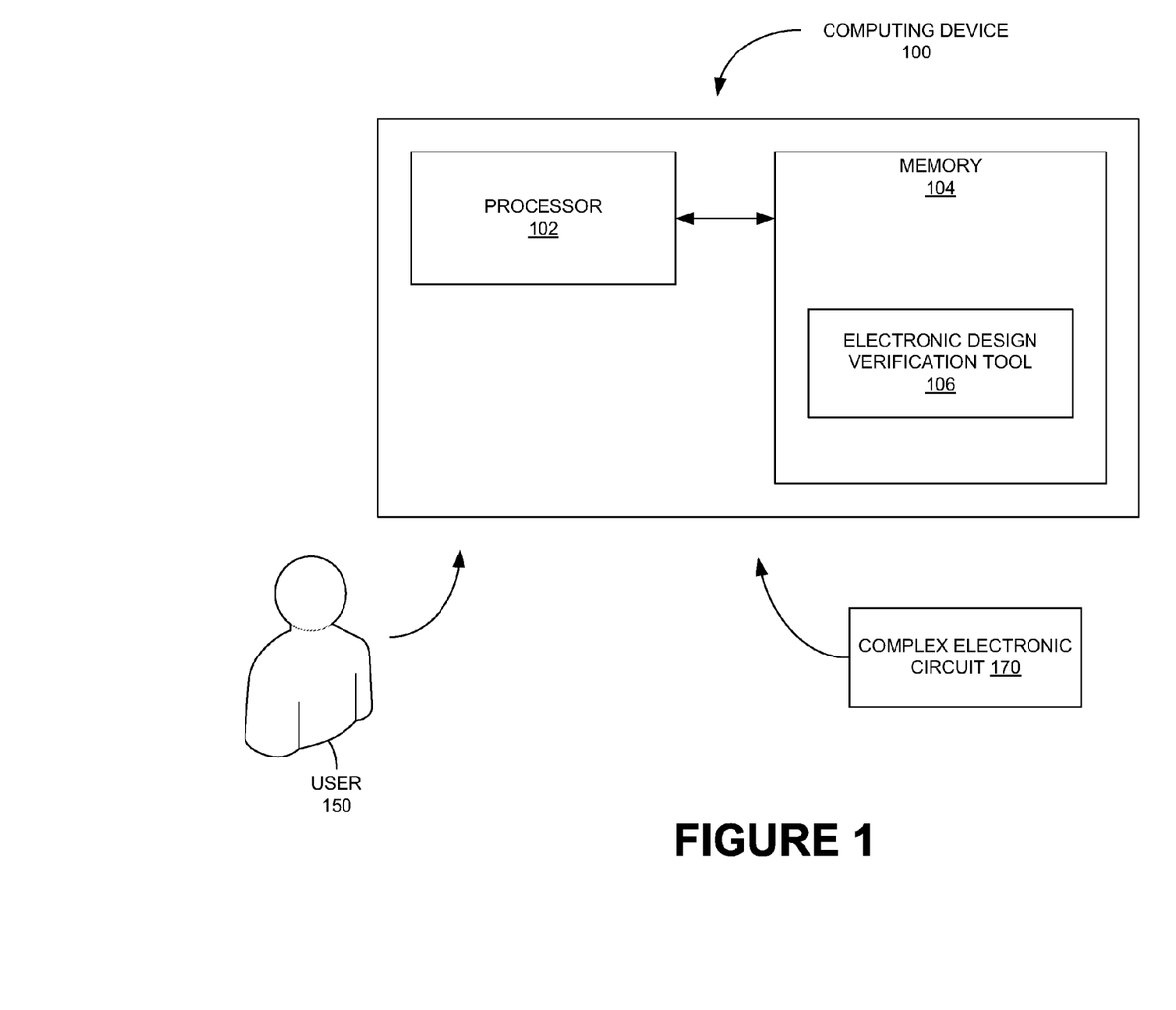
FIG. 1 is a schematic view of a computing device, according to one or more embodiments.

FIG. 1 shows a computing device 100, according to one or more embodiments. In one or more embodiments, computing device 100 may include a processor 102 (e.g., a Central Processing Unit (CPU), a Graphics Processing Unit (GPU); one or more processors) communicatively coupled to a memory 104 (e.g., a volatile memory and/or a non-volatile memory; one or more memories). Computing device 100, for example, may be a personal computer, a laptop computer, a notebook computer, a netbook, a tablet or even a computing node in a cluster computing system. Other forms of computing device 100 are within the scope of the exemplary embodiments. In one or more embodiments, computing device 100 may execute an electronic design verification tool 106 on processor 102; FIG. 1 shows instructions associated with electronic design verification tool 106 being stored in memory 104.

Executing a gate-level simulation (GLS) of a complex electronic circuit 170 on processor 102 may be a computationally challenging process; said GLS may also be a critical component of the design cycle of electronic circuit 170. For example, the GLS may be a fault simulation associated with electronic circuit 170 involving a number of elements of a component library (e.g., stored in memory 104 as part of electronic design verification tool 106); said elements may be gates (e.g., AND, NAND, NOR), flip-flops, latches etc. The computational challenge may be due to large simulation-times and/or memory requirement. A common technique utilized to speed up simulation time may involve gate-level pruning, which also reduces the memory footprint required to run the GLS. Such a gate-level pruning process may be non-trivial and iterative; it also requires complete design knowledge on part of a user (e.g., designer, verification engineer); FIG. 1 shows user 150 of computing device 100.

Figure 2:
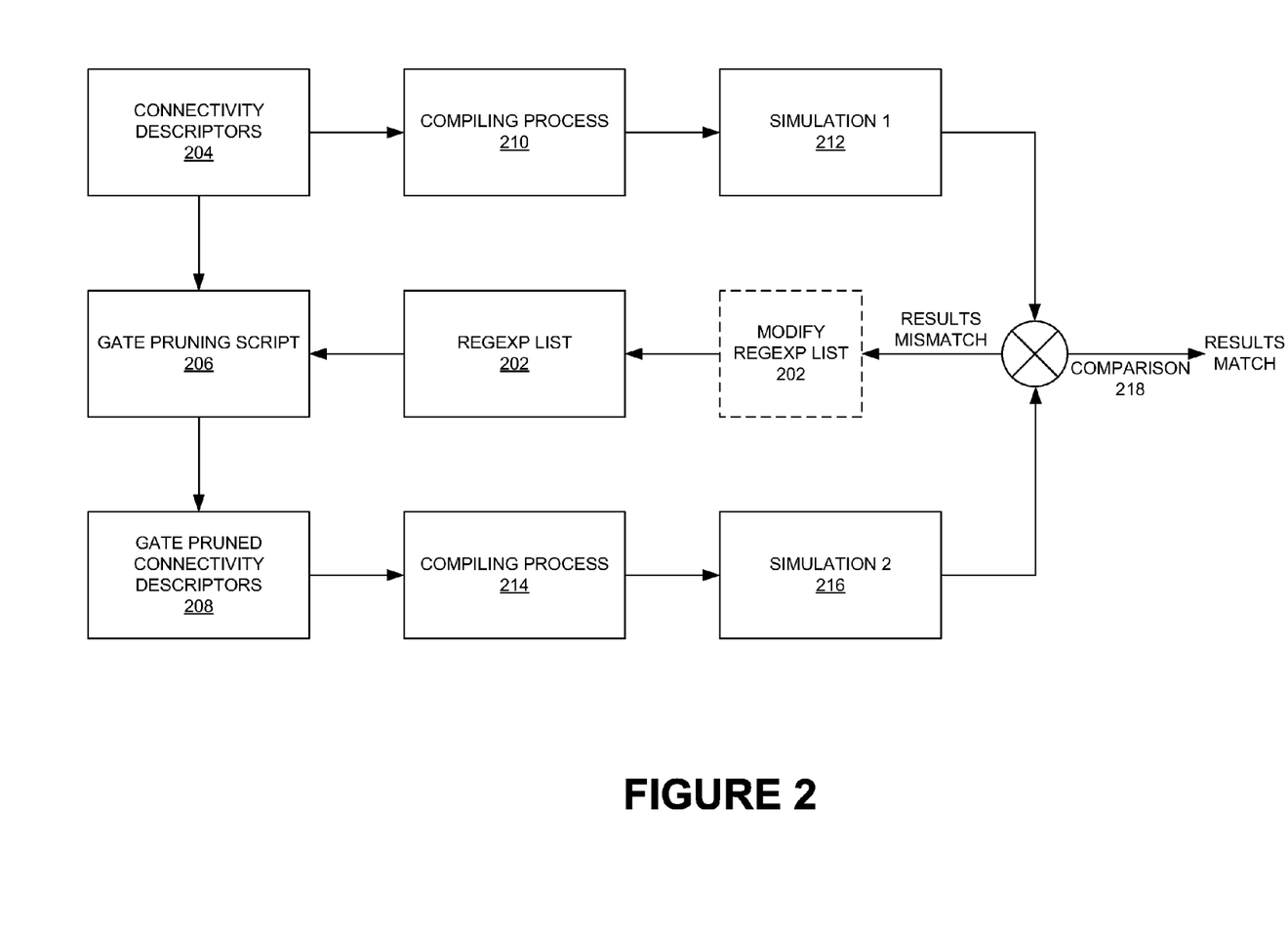
FIG. 2 is a schematic view of a gate-level pruning process with regard to design simulation/verification of an electronic circuit.

FIG. 2 shows the gate-level pruning process. The gate-level pruning involved may be a manual process based on what is known as a regular expression list (regexplist 202). regexplist 202 may be a list of regular expressions related to matching strings of text associated with elements of electronic circuit 170. regexplist 202 may be provided by user 150. Further, connectivity descriptors 204 (e.g., netlists) of electronic circuit 170 may be available through electronic design verification tool 106. Here, a connectivity descriptor may serve to describe interconnections (or, serve as nodal descriptions of) between the fundamental elements of electronic circuit 170.

Processor 102 may execute a gate pruning script 206 (e.g., a set of instructions) thereon that takes regexplist 202 and connectivity descriptors 204 as inputs and removes all elements (e.g., flip-flops) of connectivity descriptors 204 matching with regexplist 202; here, regexplist 202 may include strings of text related to said redundant elements of electronic circuit 170 that are part of connectivity descriptors 204. Further, all combinatorial logic associated with electronic circuit 170 that does not have start-point(s) or end-point(s) (e.g., ports, memory elements) may be removed (e.g., through execution of gate pruning script 206).

With the removal of the redundant elements and the combinatorial logic, gate-pruned connectivity descriptors 208 may be generated. Connectivity descriptors 204 may input into a compiling process 210 and the gate-level simulation (e.g., simulation 1 212) may be executed. Further, gate pruned connectivity descriptors 208 may be fed into another compiling process 214 and the gate-level simulation (e.g., simulation 2 216) executed. The results of simulation 1 212 and simulation 2 216 may be compared (e.g., comparison 218). When there is a mismatch, regexplist 202 may be modified (e.g., manually through user 150) and fed once again into gate pruning script 206; the iterative process continues until the results of simulation 1 212 and simulation 2 216 match.

As the abovementioned gate pruning process is at the gate-level, no work may be done prior to synthesis. The only way to compare a working and a non-working simulation may be to execute the full-circuit simulation and generate a dump for enabling debugging in case of a failure. Further, generation of regexplist 202 may be a tedious, manual process, where it may be impossible to scan a complete design of electronic circuit 170. Portability across different System-on-a-Chip (SoC)/processor-architectures may not be possible. Last but not the least, there may be no register-level (e.g., Register-Transfer Level (RTL)) equivalence of the gate-pruning model.

Figure 3:
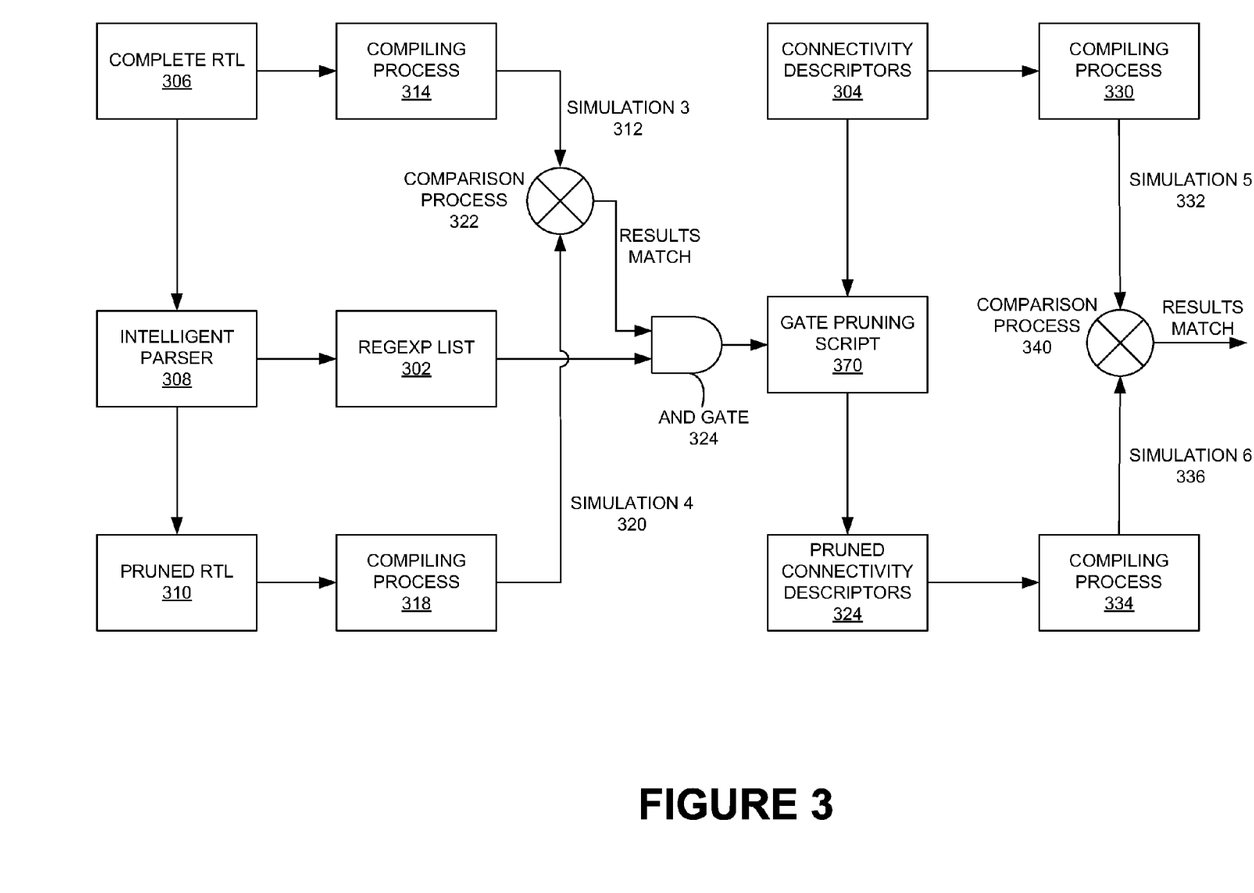
FIG. 3 is a schematic view of a standardizable process of electronic circuit verification and simulation configured to bring predictability thereto, according to one or more embodiments.

FIG. 3 shows a standardizable process of electronic circuit verification and simulation configured to bring predictability thereto, according to one or more embodiments. In one or more embodiments, the standardizable process may be based on parsing the RTL design for autogeneration of a regexplist 302 required for gate pruning of the connectivity descriptors (e.g., connectivity descriptors 304 to gate pruned connectivity descriptors 324). In one or more embodiments, the complete RTL 306 for electronic circuit 170 may be fed into an intelligent parser 308 to be parsed therethrough to create a list of regular expressions (e.g., regexplist 302) that includes the list of modules/elements of electronic circuit 170 that are redundant (or, that can be stubbed). For example, modules/elements that affect clocking, resets, debug port (e.g., Joint Test Action Group (JTAG) interface) programming and test logic modules may be preserved by default. Further, modules/elements specific to a test may be preserved.

In one or more embodiments, parser 308 may also generate a pruned version of complete RTL 306, which is shown in FIG. 3 as pruned RTL 310. Now, in one or more embodiments, complete RTL 306 may be compiled (e.g., in compiling process 314) and the simulation (e.g., simulation 3 312) executed. Further, in one or more embodiments, pruned RTL 310 may also be compiled (e.g., in compiling process 318) and the simulation (e.g., simulation 4 320) executed. In one or more embodiments, the results of simulation 3 312 and simulation 4 320 may be compared (e.g., comparison 322). In one or more embodiments, only when there is a match between simulation 3 312 and simulation 4 320, regexplist 302 may be fed into gate pruning script 370 (analogous to gate pruning script 206). The aforementioned process is shown through an AND gate 324 configured to have the result of the matching between simulation 3 312 and simulation 4 320 and regexplist 302 as inputs thereto. Other implementations are within the scope of the exemplary embodiments discussed herein.

In one or more embodiments, regexplist 302 may be fed into gate pruning script 370 also configured to receive connectivity descriptors 304 to generate gate pruned connectivity descriptors 324. Again, in one or more embodiments, connectivity descriptors 304 may be fed into a compiling process 330 and the simulation (e.g., simulation 5 332) executed. Further, in one or more embodiments, gate pruned connectivity descriptors 324 may be fed into another compiling process 334 and the simulation (e.g., simulation 6 336) executed. In one or more embodiments, the results of simulation 5 332 and simulation 6 336 may be compared (e.g., in comparison process 340) and a match therebetween determined. It is obvious that the match determining process may be quicker than that in the gate-level pruning process discussed with regard to FIG. 2; further the match determining process discussed with regard to FIG. 3 may leave less of a memory footprint.

Figure 4:
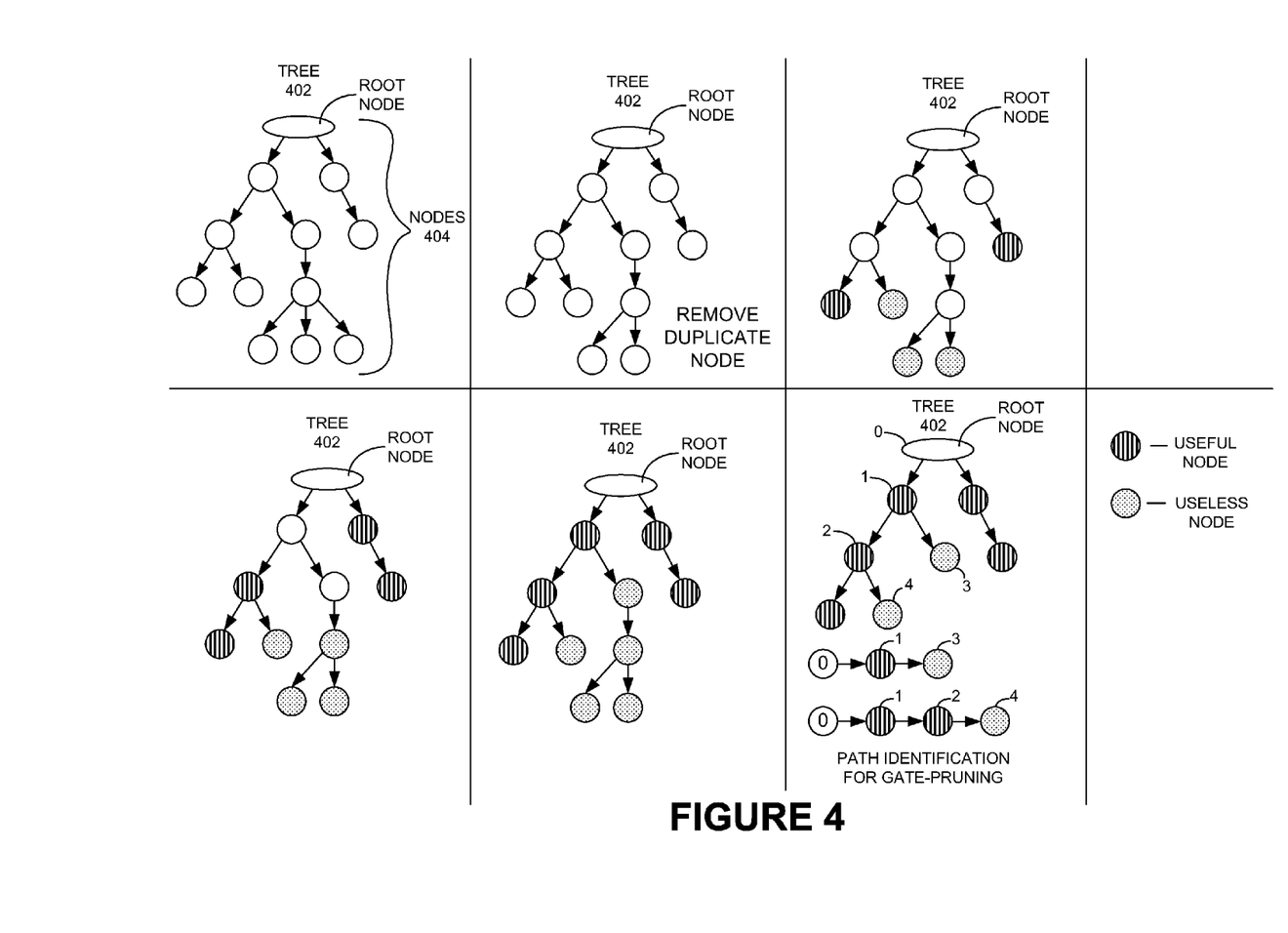
FIG. 4 is a schematic view of generation of a list of regular expressions related to enabling text-matching of strings with elements of an electronic circuit, according to one or more embodiments.

FIG. 4 shows generation of regexplist 302, according to one or more embodiments. In one or more embodiments, complete RTL 306 for electronic circuit 170 may be read (e.g., through processor 102) and a tree 402 (e.g., a data structure) of all instances of objects (e.g., circuit elements/components) created. In one or more embodiments, each node 404 of tree 402 may be traversed and the definition thereof scanned. In one or more embodiments, based on some keywords (e.g., fuse, JTAG, clock reset), the decision to preserve or discard a node 404 may be taken. In one or more embodiments, the aforementioned keywords may be determined/decided by user 150 or a designer.

In one or more embodiments, once the traversal of all nodes 404 is completed, a list of regular expressions (e.g., regexplist 302) of names of instances that can be removed from the design based on names of nodes 404 may be created. In one or more embodiments, a module of tree 402 in which all nodes 404 are identified as useless for a particular simulation may be given a new definition (e.g., stub). The stub may merely have the port definition thereof and no driver or load inside the module. In one or more embodiments, thus, there may merely be two kinds of module/element definitions, viz. one set of nodes 404 having original definition(s) and another set of nodes 404 that is stubbed. In one or more embodiments, the new definition of the design, viz. gate pruned connectivity descriptors 324 may be complied and simulated at a reduced design size, as discussed above. While the aforementioned simulation may fail and may require fine-tuning of the keywords, which is an iterative process, RTL iteration is very cheap compared to the gate level iteration discussed with regard to FIG. 2.

FIG. 4 shows nodes 404 of tree 402 and distinguishes between a top level node (or, a root node) 404, a node 404 that is identified as useful and a node 404 that is deemed useless. Firstly, duplicate nodes 404 may be removed. Then, the important and the useless nodes 404 may be identified at the lowest level, followed by the same identification of the important and the useless nodes 404 at the next higher level until the root node 404 (top level node 404) is reached. FIG. 4 shows the process leading to the path identification for gate-pruning discussed with regard to FIG. 3. Here, 0→1→3 and 0→1→2→4 are the two paths/regular expressions identified for gate-pruning. In one example embodiment, if a parent node 404 has all child nodes 404 thereof deemed useless, only parent node 400 may be transmitted to a final regexplist 302. In FIG. 4, 3 and 4 are marked for prospective modification/discarding, if required due to the failure of the simulation using gate pruned connectivity descriptors 324.

Thus, in one or more embodiments, the abovementioned gate pruning process discussed with regard to FIG. 3 may be standardized as a design practice that can be performed at an early phase of the design (e.g., RTL verification); gate-level verification, therefore, may be eliminated from critical paths of electronic circuit 170 (e.g., Very-Large-Scale-Integration (VLSI) circuit) design process. In one or more embodiments, the abovementioned approach may also speed up the RTL simulation and reduce effort required on part of user 150. Again, in one or more embodiments, the memory footprint may be reduced; therefore, more simulations may be executed in a given time frame, which facilitates compatibility of the optimized process with cluster computing nodes.

In one or more embodiments, RTL debugging may be easier than gate-level debugging. Last but not the least, in one or more embodiments, the abovementioned optimized process may be architecture independent.

It should be noted that the abovementioned optimized process may not be limited to the RTL and the gate-level; the preconditioning discussed above (e.g., auto-generation of regexplist 302) may be performed at any level/stage higher than a level/stage of design verification/simulation that is to be optimized. Further, in one or more embodiments, the keywords discussed with regard to FIG. 3 may be selected based on input from design/verification specialists, and, therefore, streamlined in better ways.

It is obvious that instructions associated with the optimization discussed above may be available on a non-transitory medium (e.g., Compact Disc (CD), Digital Video Disc (DVD), Blu-ray® disc, hard-disk (e.g., downloaded from the Internet)) readable and executable on computing device 100. Alternately, the instructions may be available in a module/pipeline executing on processor 102, may be packaged with an operating system/application (e.g., an application suite such as electronic design verification tool 106) and/or available as part of a driver component. In another example embodiment, the aforementioned instructions may be downloadable as an add-on patch to design verification tool 106. It should further be noted that the tree data structure discussed above has been employed merely for example purposes. Other types of data structures such as hashes and linked lists are within the scope of the exemplary embodiments discussed herein. All reasonable and possible variations are within the scope of the exemplary embodiments discussed herein.

Figure 5:
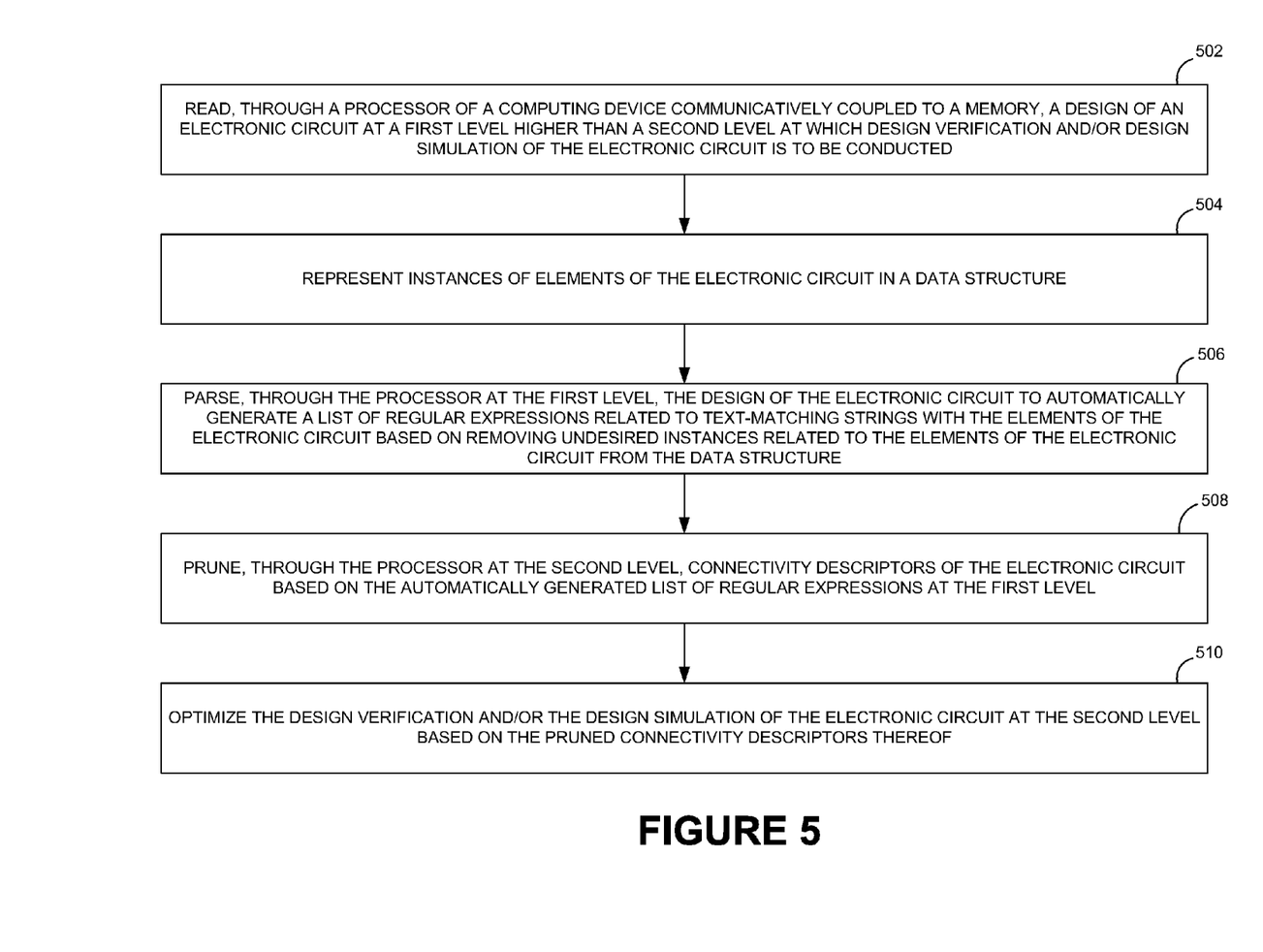
FIG. 5 is a process flow diagram detailing the operations involved in an optimized simulation technique for design verification of an electronic circuit, according to one or more embodiments.

FIG. 5 shows a process flow diagram detailing the operations involved in an optimized simulation technique for design verification of electronic circuit 170, according to one or more embodiments. In one or more embodiments, operation 502 may involve reading, through processor 102 of computing device 100 communicatively coupled to memory 104, a design of electronic circuit 170 at a first level (e.g., RTL) higher than a second level (e.g., gate-level) at which design verification and/or design simulation of electronic circuit 170 is to be conducted. In one or more embodiments, operation 504 may involve representing instances of elements of electronic circuit 170 in a data structure (e.g., tree 402). In one or more embodiments, operation 506 may involve parsing, through processor 102 at the first level, the design of electronic circuit 170 to automatically generate a list of regular expressions (e.g., regexplist 302) related to text-matching strings with the elements of electronic circuit 170 based on removing undesired instances related to the elements of electronic circuit 170 from the data structure.

In one or more embodiments, operation 508 may involve pruning, through processor 102 at the second level, connectivity descriptors 304 of electronic circuit 170 based on the automatically generated list of regular expressions at the first level. In one or more embodiments, operation 510 may then involve optimizing the design verification and/or the design simulation of electronic circuit 170 at the second level based on the pruned connectivity descriptors (e.g., pruned connectivity descriptors 324) thereof.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry (e.g., CMOS based logic circuitry), firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or Digital Signal Processor (DSP) circuitry).

In addition, it will be appreciated that the various operations, processes, and methods disclosed herein may be embodied in a machine-readable medium and/or a machine accessible medium compatible with a data processing system (e.g., computing device 100). Accordingly, the specification and drawings are to be regarded in an illustrative rather than a restrictive sense.

What is claimed is:

1. A method comprising:
reading, through a processor of a computing device communicatively coupled to a memory, a design of an electronic circuit at a first level higher than a second level at which at least one of design verification and design simulation of the electronic circuit is to be conducted;
representing instances of elements of the electronic circuit in a data structure;
parsing, through the processor at the first level, the design of the electronic circuit to automatically generate a list of regular expressions related to text-matching strings with the elements of the electronic circuit based on removing undesired instances related to the elements of the electronic circuit from the data structure;
pruning, through the processor at the second level, connectivity descriptors of the electronic circuit based on the automatically generated list of regular expressions at the first level; and
optimizing the at least one of the design verification and the design simulation of the electronic circuit at the second level based on the pruned connectivity descriptors thereof.

2. The method of claim 1, wherein the first level is a Register-Transfer Level (RTL) and the second level is a gate level.

3. The method of claim 1, wherein the parsing of the design of the electronic circuit includes traversing through nodes of the data structure to one of: preserve and discard a node thereof based on at least one keyword.

4. The method of claim 3, further comprising at least one of:
determining a root node of the data structure;
distinguishing between a node identifiable as useful and a node identifiable as useless progressively from a lowest level of the data structure to the highest level thereof; and
identifying at least one path of the data structure for pruning of the connectivity descriptors.

5. The method of claim 4, further comprising solely transmitting a parent node of the data structure to a final list of regular expressions related to the text-matching of the strings with the elements of the electronic circuit if the parent node has all child nodes thereof deemed useless.

6. The method of claim 3, further comprising at least one of:
one of modifying and discarding a node based on failure of the at least one of the design verification and the design simulation of the electronic circuit using the pruned connectivity descriptors; and
fine-tuning the at least one keyword based on the failure of the at least one of the design verification and the design simulation of the electronic circuit using the pruned connectivity descriptors.

7. The method of claim 1, comprising providing instructions to at least one of: read the design of the electronic circuit at the first level, represent the instances of the elements of the electronic circuit in the data structure, parse the design of the electronic circuit to automatically generate the list of regular expressions, prune the connectivity descriptors of the electronic circuit and optimize the at least one of the design verification and the design simulation of the electronic circuit at the second level through at least one of: a module executing on the processor, packaging thereof with at least one of an operating system and an application executing on the computing device, and a driver component.

8. A computing device comprising:
a memory; and
a processor communicatively coupled to a memory, the processor being configured to execute instructions to:
read a design of an electronic circuit at a first level higher than a second level at which at least one of design verification and design simulation of the electronic circuit is to be conducted,
represent instances of elements of the electronic circuit in a data structure,
parse, at the first level, the design of the electronic circuit to automatically generate a list of regular expressions related to text-matching strings with the elements of the electronic circuit based on removing undesired instances related to the elements of the electronic circuit from the data structure,
prune, at the second level, connectivity descriptors of the electronic circuit based on the automatically generated list of regular expressions at the first level, and
optimize the at least one of the design verification and the design simulation of the electronic circuit at the second level based on the pruned connectivity descriptors thereof.

9. The computing device of claim 8, wherein the first level is an RTL and the second level is a gate level.

10. The computing device of claim 8, wherein the processor is configured to execute instructions to parse the design of the electronic circuit based on traversing through nodes of the data structure to one of: preserve and discard a node thereof based on at least one keyword.

11. The computing device of claim 10, wherein the processor is further configured to execute instructions to at least one of:
determine a root node of the data structure,
distinguish between a node identifiable as useful and a node identifiable as useless progressively from a lowest level of the data structure to the highest level thereof, and
identify at least one path of the data structure for pruning of the connectivity descriptors.

12. The computing device of claim 11, wherein the processor is further configured to execute instructions to solely transmit a parent node of the data structure to a final list of regular expressions related to the text-matching of the strings with the elements of the electronic circuit if the parent node has all child nodes thereof deemed useless.

13. The computing device of claim 10, wherein the processor is further configured to execute instructions to at least one of:
- one of modify and discard a node based on failure of the at least one of the design verification and the design simulation of the electronic circuit using the pruned connectivity descriptors, and
- fine-tune the at least one keyword based on the failure of the at least one of the design verification and the design simulation of the electronic circuit using the pruned connectivity descriptors.

14. The computing device of claim 8, wherein instructions to at least one of: read the design of the electronic circuit at the first level, represent the instances of the elements of the electronic circuit in the data structure, parse the design of the electronic circuit to automatically generate the list of regular expressions, prune the connectivity descriptors of the electronic circuit and optimize the at least one of the design verification and the design simulation of the electronic circuit at the second level are provided through at least one of: a module executing on the processor, packaging thereof with at least one of an operating system and an application executing on the computing device, and a driver component.

15. A non-transitory medium, readable through a computing device and including instructions embodied therein that are executable through the computing device, comprising instructions to:
- read, through a processor of the computing device communicatively coupled to a memory, a design of an electronic circuit at a first level higher than a second level at which at least one of design verification and design simulation of the electronic circuit is to be conducted;
- represent instances of elements of the electronic circuit in a data structure;
- parse, through the processor at the first level, the design of the electronic circuit to automatically generate a list of regular expressions related to text-matching strings with the elements of the electronic circuit based on removing undesired instances related to the elements of the electronic circuit from the data structure;
- prune, through the processor at the second level, connectivity descriptors of the electronic circuit based on the automatically generated list of regular expressions at the first level; and
- optimize the at least one of the design verification and the design simulation of the electronic circuit at the second level based on the pruned connectivity descriptors thereof.

16. The non-transitory medium of claim 15, comprising instructions compatible with the first level being an RTL and the second level being a gate level.

17. The non-transitory medium of claim 15, comprising instructions to parse the design of the electronic circuit based on traversing through nodes of the data structure to one of: preserve and discard a node thereof based on at least one keyword.

18. The non-transitory medium of claim 17, further comprising instructions to at least one of:
- determine a root node of the data structure;
- distinguish between a node identifiable as useful and a node identifiable as useless progressively from a lowest level of the data structure to the highest level thereof; and
- identify at least one path of the data structure for pruning of the connectivity descriptors.

19. The non-transitory medium of claim 18, further comprising instructions to solely transmit a parent node of the data structure to a final list of regular expressions related to the text-matching of the strings with the elements of the electronic circuit if the parent node has all child nodes thereof deemed useless.

20. The non-transitory medium of claim 17, further comprising instructions to at least one of:
- one of modify and discard a node based on failure of the at least one of the design verification and the design simulation of the electronic circuit using the pruned connectivity descriptors; and
- fine-tune the at least one keyword based on the failure of the at least one of the design verification and the design simulation of the electronic circuit using the pruned connectivity descriptors.

* * * * *